(12) United States Patent
Dubhashi

(10) Patent No.: US 6,867,576 B2
(45) Date of Patent: Mar. 15, 2005

(54) CURRENT SENSE CIRCUIT FOR MOTOR DRIVE

(75) Inventor: Ajit Dubhashi, Redondo Beach, CA (US)

(73) Assignee: International Rectifier Corporation, El Segundo, CA (US)

(*) Notice: Subject to any disclaimer, the term of this patent is extended or adjusted under 35 U.S.C. 154(b) by 55 days.

(21) Appl. No.: 10/262,171

(22) Filed: Sep. 30, 2002

(65) Prior Publication Data

US 2003/0067317 A1 Apr. 10, 2003

Related U.S. Application Data

(60) Provisional application No. 60/325,203, filed on Sep. 28, 2001.

(51) Int. Cl.[7] ............................................. G01R 29/00
(52) U.S. Cl. ................................................. 324/76.79
(58) Field of Search ........................... 324/76.79, 763, 324/769

(56) References Cited

U.S. PATENT DOCUMENTS 5,877,617 A * 3/1999 Ueda ........................ 323/316
5,917,319 A * 6/1999 Frank et al. .............. 324/158.1

* cited by examiner

*Primary Examiner*—N. Le
*Assistant Examiner*—Timothy J. Dole
(74) *Attorney, Agent, or Firm*—Ostrolenk, Faber, Gerb & Soffen, LLP

(57) ABSTRACT

A small capacity FET is coupled to a power MOSFET to sense voltage across the power MOSFET for determining current carried through the power MOSFET. The FET is turned on when the power MOSFET is turned on to obtain a sense voltage that is fed to a comparator to determine if the voltage across the power MOSFET exceeds a threshold voltage. The output of the comparator is used to shut off the drive for the power MOSFET if the threshold is exceeded. The voltage across the FET can be used with a temperature sense and knowledge of the FET $R_{DSON}$ to obtain a sense feedback of current through the power MOSFET. The FET is controlled with a delay to turn on after the power MOSFET is turned on, and turns off before the power MOSFET turns off.

15 Claims, 2 Drawing Sheets

CURRENT SENSE CIRCUIT FOR MOTOR DRIVE

RELATED APPLICATION

This application is based on and claims priority to U.S. Provisional Application Ser. No. 60/325,203, filed Sep. 28, 2001 by Ajit Dubhashi entitled CURRENT SENSE CIRCUIT FOR MOTOR DRIVE the subject matter and disclosure of which is incorporated by reference herein.

BACKGROUND OF THE INVENTION

"Desaturation" detection is commonly used in bipolar transistor and IGBT based power processors. A commonly used scheme is shown in FIG. 1. It consists of connecting diode to the collector of the device. The voltage on the anode of the diode is equal to its voltage drop plus the voltage drop across the power device. In case of an over current/short circuit condition, the voltage across the FET/IGBT rises and thus the anode voltage of the diode also rises. This voltage is fed (sometimes through a resistive divider) to a comparator with a preset limit. If the voltage goes above this limit, the device is turned off. This works well for IGBTs which have forward drops in the order of 2 to 3 volts and, as the diode D1's drop is 0.5V, it does not substantially add to sensed voltage.

One problem with this method is that when it is used in conjunction with low voltage MOSFETs which have low on-resistance ($R_{dson}$), the MOSFET voltage is about 0.18V and the diode drop is much higher than this voltage. As a result, the accuracy/tolerance of the trip current is very poor. It can vary over a wide range which is sometimes unacceptable in the application.

SUMMARY OF THE INVENTION

In accordance with the present invention, there is a provided a FET in place of the diode connected to the MOSFET. The FET is small in size and therefore provides a reduce cost for construction of the circuit. The FET can be driven to be turned on and off to assist with appropriate desaturation. In addition, the FET can be used to measure voltage across the MOSFET to provide a current feedback.

These and other advantages of the present invention are described below in detail with reference to the accompanying drawings.

DETAILED DESCRIPTION OF THE PREFERRED EMBODIMENTS

Figure 1:
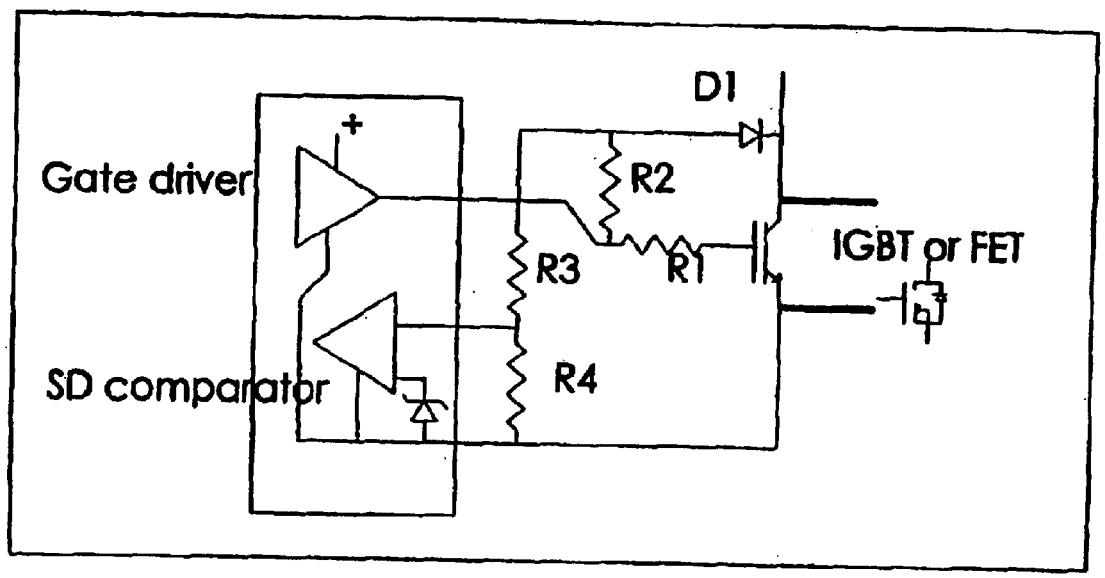
FIG. 1 shows a prior art "desaturation detection" circuit schematic.
Figure 2:
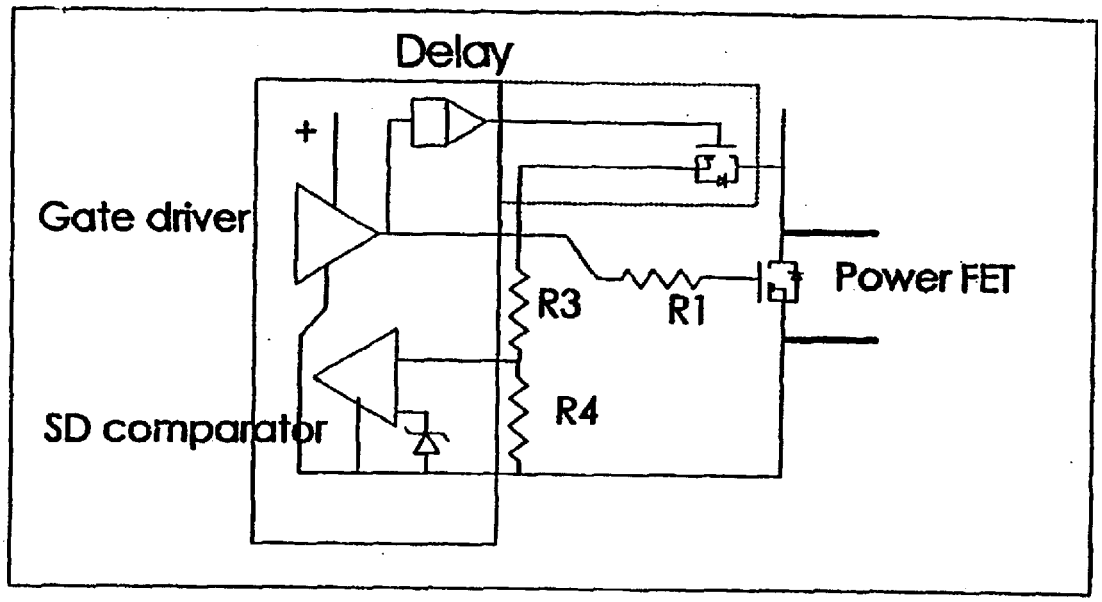
FIG. 2 is a schematic diagram of the circuit of the present invention.

The present invention overcomes the deficiencies of the prior art noted above by providing a circuit in which the diode is replaced with a FET (very small in size and cost) to sense the voltage on the drain of the main power MOSFET. As the current through the small FET is tiny (e.g., 1 ma) and it has a resistive characteristic (like any FET), there is no non-linear output voltage characteristic as is present in the prior art configuration of FIG. 1. The FET is driven through a driver that has asymmetrical delay in its output. When the power MOSFET is commanded to be ON, the small MOSFET is turned on about 1 usec after this event. At turn off, the small FET is turned off before the main FET is turned off.

As a result of this turn on and off scheme, the voltage across the power FET (which is linearly proportional to the current) is transmitted to the source of the small FET. This can then be used to feed the comparator which can trip the power FET with a better tolerance.

Figure 3:
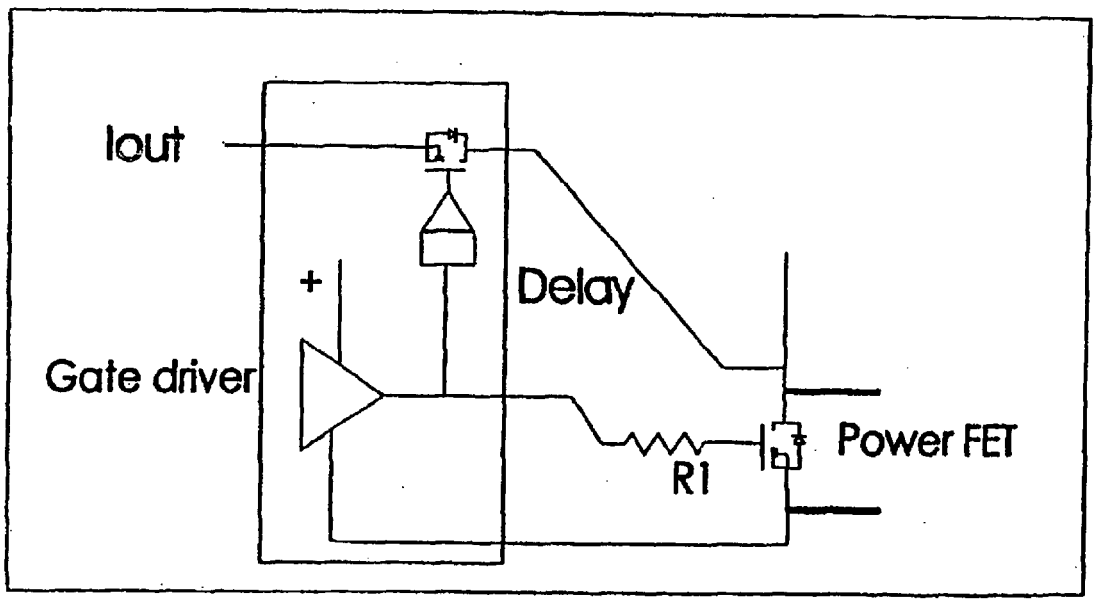
FIG. 3 is a schematic diagram of the use of the present invention for calculating the current in a power FET by providing an analog voltage across the FET.

Referring to FIG. 3, the use of a small FET in accordance with the present invention can also be used to calculate the current in the power FET by providing an analog voltage across the power MOSFET. The controller can estimate the load current by using this voltage and the knowledge of the power FET Rdson and the temperature of the power FET.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A current sense circuit for detecting current through a power MOSFET, comprising:
   a FET having a rating smaller than the power MOSFET and connected to the power MOSFET for sensing voltage across the power MOSFET, the voltage being related to current through the power MOSFET;
   a comparator coupled to the FET for producing a comparator output based on a comparison between the voltage sensed by the FET and a threshold voltage;
   a driver for the power MOSFET and coupled to the comparator output, such that the driver turns off the power MOSFET when the comparator output indicates an overcurrent condition; and
   a driver element for the FET operable to turn the FET on and off in relation to operation of the driver for the power MOSFET.

2. The current sense circuit according to claim 1, wherein the voltage sensed by the FET is related to a voltage across the power MOSFET.

3. A current sense circuit according to claim 1, further comprising:
   a controller for controlling the MOSFET driver; and
   the voltage sensed by the FET is coupled to the controller to permit the controller to calculate a current drawn through the power MOSFET based on the voltage sensed by the FET.

4. A current sense circuit according to claim 1, further comprising a delay element coupled to the FET driver element, and operable to prevent the FET from being turned on until after the power MOSFET is turned on.

5. The current sense circuit according to claim 4, wherein the delay element provides a delay of about 1 microsecond.

6. The current sense circuit according to claim 1, further comprising a delay element coupled to the driver for the FET, and operable to prevent the FET from turning on until after the power MOSFET is turned on, and operable to turn off the FET before the power MOSFET is turned off.

7. A method for sensing current across a power MOSFET, comprising:
   providing a FET having a rating less than that of a power MOSFET and coupled to the power MOSFET;
   turning on the FET when the power MOSFET is turned on;

obtaining a sensed voltage across the FET related to the voltage across the power MOSFET;

comparing the sensed voltage to a threshold voltage; and turning off the power MOSFET when the sensed voltage exceeds the threshold voltage.

8. The method according to claim 7, further comprising delaying turning on the FET until the power MOSFET is turned on.

9. The method according to claim 8, further comprising turning off the FET before turning off the power MOSFET.

10. The method according to claim 9, wherein the FET is turned off before the power MOSFET is turned off with a time difference of about 1 microsecond.

11. The method according to claim 8, wherein the FET is turned on with a delay of about 1 microsecond after the power MOSFET is turned on.

12. A sense circuit for sensing parameters of an operational power MOSFET, comprising:

a FET having a rating smaller than the power MOSFET, coupled to a source or drain of the power MOSFET to receive a voltage from the power MOSFET related to an operational parameter of the power MOSFET;

a comparator coupled to the FET for producing a comparator output based on the comparison between the voltage received by the FET and a threshold voltage;

a driver for the power MOSFET and coupled to the comparator output, such that the driver turns off the power MOSFET when the comparator output indicates an overcurrent condition; and a component connected to the FET separate from the driver for the power MOSFET and operable to turn the FET on and off in relation to operation of the driver for the power MOSFET.

13. The sense circuit according to claim 12, wherein the operational parameter of the power MOSFET sensed by the FET is a voltage across the source and drain of the power MOSFET.

14. A sense circuit according to claim 12, wherein the component is a delay element and operable to prevent the FET from being turned on or off when the driver for the power MOSFET provides a signal to cause the power MOSFET to conduct.

15. The sense circuit according to claim 12, further comprising a resistor divider network coupled between the FET and the comparator for scaling the voltage received by the FET.

* * * * *